(12) United States Patent
Maru et al.

(10) Patent No.: US 8,183,767 B2
(45) Date of Patent: May 22, 2012

(54) DISPLAY APPARATUS AND IMAGING SYSTEM USING THE SAME

(75) Inventors: Hiroyuki Maru, Kawasaki (JP); Osamu Yuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 247 days.

(21) Appl. No.: 12/167,767

(22) Filed: Jul. 3, 2008

(65) Prior Publication Data

US 2009/0009076 A1 Jan. 8, 2009

(30) Foreign Application Priority Data

Jul. 6, 2007 (JP) ................................. 2007-178089
May 30, 2008 (JP) ................................. 2008-142260

(51) Int. Cl.
*H01J 1/62* (2006.01)
(52) U.S. Cl. ........................................ 313/506; 313/500
(58) Field of Classification Search ........... 313/498–512
See application file for complete search history.

(56) References Cited

U.S. PATENT DOCUMENTS

| | | | |
|---|---|---|---|
| 6,570,584 B1 | 5/2003 | Cok et al. ..................... 345/690 |
| 2004/0222999 A1 | 11/2004 | Choi et al. | |
| 2004/0251820 A1 | 12/2004 | Cok et al. | |
| 2005/0040756 A1 | 2/2005 | Winters et al. | |
| 2005/0236981 A1 | 10/2005 | Cok et al. | |
| 2006/0091380 A1 | 5/2006 | Yuuki et al. ..................... 257/40 |
| 2006/0238119 A1* | 10/2006 | Spindler ....................... 313/506 |
| 2006/0238120 A1 | 10/2006 | Miller et al. | |
| 2007/0090751 A1* | 4/2007 | Cok et al. ..................... 313/501 |
| 2007/0132369 A1* | 6/2007 | Forrest et al. ................. 313/503 |

FOREIGN PATENT DOCUMENTS

| | | |
|---|---|---|
| EP | 1475771 | 11/2004 |
| JP | 2003-272857 | 9/2003 |
| JP | 2006-163068 | 6/2006 |

OTHER PUBLICATIONS

European Office Action issued in corresponding application No. 08159698.3 dated Jul. 12, 2011—7 pages.

* cited by examiner

*Primary Examiner* — Bumsuk Won
(74) *Attorney, Agent, or Firm* — Fitzpatrick, Cella, Harper & Scinto

(57) ABSTRACT

Provided is a display apparatus including multiple light emitting devices, in which each of the light emitting devices includes a reflective layer and a light emitting layer which are stacked, using interference between light directed from the light emitting layer to the reflective layer so as to be reflected by the reflective layer and light directed from the light emitting layer in the direction opposite to the reflective layer, and in which the multiple light emitting devices include a first light emitting device, a second light emitting device having a light emission color different from the first light emitting device, and a third light emitting device having the same emission spectrum as a spectrum in which light emission of the first light emitting device and light emission of the second light emitting device are mixed.

5 Claims, 14 Drawing Sheets

DISPLAY APPARATUS AND IMAGING SYSTEM USING THE SAME

BACKGROUND OF THE INVENTION

1. Field of the Invention

The present invention relates to a display apparatus and an imaging system using the same.

2. Description of the Related Art

Recently, developments of organic electroluminescence (organic EL) have been actively pursued.

For example, Japanese Patent Application Laid-Open No. 2003-272857 discloses a white organic EL device including a blue (B) light emitting layer and a yellow (Y) or red (R) light emitting layer that are stacked.

In addition, there is known a display apparatus that can emit color light, which includes materials emitting red, green (G) and blue colors and an organic layer formed and stacked on a substrate so as to form sub-pixels arranged in the form of matrix.

There is also known a color matrix display apparatus having a similar color configuration. This display apparatus includes a material emitting white (W) color and an organic layer formed and stacked on a substrate so as to form a matrix, on which color filters of R, G and B are stacked.

Further, there is also known a matrix display apparatus including W sub-pixels without a color filter in addition to the above-mentioned R, G and B sub-pixels with the color filter, so the R, G, B, and W sub-pixels perform color display. For example, U.S. Pat. No. 6,570,584 discloses a display apparatus including sub-pixels of colors more than R, G and B.

U.S. Pat. No. 6,570,584 discloses a method for driving such a device, in which light emissions of an R light emitting device, a G light emitting device, a B light emitting device and a W light emitting device are mixed based on a calculation so that a desired color can be generated.

On the other hand, Japanese Patent Application Laid-Open No. 2006-163068 describes that the chromaticity of white obtained by a light emitting material is actually not a target chromaticity of white in many cases, so it is necessary to add light emission of an RGB unit pixel for color matching to a white light emission of a unit pixel for a white display. Japanese Patent Application Laid-Open No. 2006-163068 also discloses a signal processing way, in which an RGB input signal is mixed when the light emission chromaticity of the W pixel is different from the target chromaticity of white.

It may be considered from the above-mentioned descriptions that it is not necessary to mix the light emissions of R+G+B sub-pixel group for color matching to the light emission of the W sub-pixel for white display when the light emission chromaticity of the W sub-pixel is set to the target chromaticity of white so as to be adapted to the light emission chromaticity of the R+G+B sub-pixel group.

However, in case of light emission without using interference (PL light emission or the like), metamerism occurs as it is as the light emission color. Even when the light emission colors are mixed, the same color appears. For example, there are prepared a "light emission in which light emission of a light emitting device used as a sub-pixel is mixed at a certain rate" and a "light emission from a sub-pixel of metamerism although the light emission has a spectrum shape different from that of a mixed spectrum of the light emission in which light emission of a light emitting device used as a sub-pixel is mixed at a certain rate."

In the following descriptions, the "light emission in which light emission of a light emitting device used as a sub-pixel is mixed at a certain rate" is referred to as "mixed light of sub-pixel group" in abbreviation. The "light emission from a sub-pixel of metamerism although the light emission has a spectrum shape different from that of a mixed spectrum of the light emission in which light emission of a light emitting device used as a sub-pixel is mixed at a certain rate" is referred to as "light emission from a sub-pixel of metamerism" in abbreviation.

In addition, a combination of plural light emissions of sub-pixels having different light emission colors is expressed by using "+". For example, a combination of light emissions of an R sub-pixel, a G sub-pixel, and a B sub-pixel is referred to as "light emissions of R+G+B sub-pixel group."

Note that, the sub-pixel means a unit of the light emitting device that can control on and off of light emission or gradation of the same. The pixel is a set of sub-pixels and means a minimum unit of a color display.

When those light emissions are mixed without interference, each light emission of the "mixed light of sub-pixel group" and the "light emission from a sub-pixel of metamerism" has the same CIE chromaticity coordinates as the mixed light thereof (hereinafter referred to as "chromaticity coordinates" simply).

However, in case of a display apparatus using interference between light emission from a light emitting device and reflection light from a reflector plate, the "mixed light of sub-pixels" and the "light emission from a sub-pixel of metamerism" have different chromaticity coordinates.

This is because that intensity of light due to interference has a characteristic according to a wavelength in a display apparatus including an interference structure under a certain condition. Therefore, in case of the above-mentioned light emissions in which different spectra of light are emitted, the spectrum after the interference is modulated so that chromaticity coordinates calculated from an integral value of the spectrum is also changed.

In the case where a W sub-pixel having different spectrum in metamerism is provided as fill light to the B+Y sub-pixel group, for example, the spectrum after the interference is modulated so that chromaticity coordinates calculated from an integral value of the spectrum is also changed.

In addition, since the spectra of both light emissions are different from each other, chromaticity after the interference is changed when a mixing ratio between the light emissions of R+G+B sub-pixel group and the light emission of W sub-pixel is changed.

In addition, when a view angle is tilted from a normal direction of a display surface so that an interference condition is changed, the chromaticity of light emissions of the B+Y sub-pixel group and the chromaticity of light emission of the W sub-pixel are changed so as to be different from each other.

In the above-mentioned Japanese Patent Application Laid-Open No. 2006-163068, light of R and/or G and/or B is emitted for color matching in case of the R+G+B sub-pixel group+the W sub-pixel. According to this control, the chromaticity can be matched with each other. However, since the spectra of both light emissions are different from each other, chromaticity after the interference is changed when the mixing ratio between the light emissions of the R+G+B sub-pixel group and the light emission of the W sub-pixel is changed.

In addition, when the view angle is tilted from the normal direction of the display surface so that the interference condition is changed, the chromaticity of light emissions of the R+G+B sub-pixel group and the chromaticity of light emission of the W sub-pixel are changed so as to be different from each other in the same manner as the above-mentioned example.

As a result, even when the chromaticity coordinates of the "mixed light of sub-pixel group" and the chromaticity coordinates of the "light emission from a sub-pixel of metamerism" are combined to form the metamerism, chromaticity coordinates of white obtained from the display surface of the display apparatus after the interference may be deviated from an expected value when the spectra are shifted.

Note that, also in the color filter type R, G, B and W display apparatus described as a background art, the R, G and B color filter arranged on the white color matrix substrate may narrow individual wavelength ranges. Therefore, even when the light emissions of the R, G and B light emitting devices are mixed, the spectrum of the mixed light does not match the spectrum of the light emission of the W sub-pixel without the color filter.

SUMMARY OF THE INVENTION

It is an object of the present invention to provide a display apparatus using an interference, in which "mixed light of sub-pixels" and "light emission from a sub-pixel of metamerism" can be mixed so as to have the same light emission color. In addition, another object of the present invention is to provide an imaging system using the display apparatus.

According to the present invention, there is provided a display apparatus including a plurality of light emitting devices, in which each of the light emitting devices includes a reflective layer and a light emitting layer which are stacked, using interference between light directed from the light emitting layer to the reflective layer so as to be reflected by the reflective layer and light directed from the light emitting layer in the direction opposite to the reflective layer, and in which the plurality of light emitting devices includes a first light emitting device, a second light emitting device having a light emission color different from the first light emitting device, and a third light emitting device having the same emission spectrum as a spectrum in which light emission of the first light emitting device and light emission of the second light emitting device are mixed.

According to the present invention, it is possible to obtain a mixed light without a chromaticity shift due to the interference. In other words, also in a display apparatus using interference, the "mixed light of sub-pixel group" and the "light emission from a sub-pixel of metamerism" can be mixed so as to have the same light emission color.

In addition, even when the "mixed light of sub-pixels" and the "light emission from a sub-pixel of metamerism" are mixed with a changed mixing ratio between them, chromaticity coordinates of the obtained light after the interference does not change.

Further, even when the view angle is tilted from a normal direction of a display surface so that an interference condition is changed, chromaticity coordinates of the obtained light after the interference does not change.

Further features of the present invention will become apparent from the following description of exemplary embodiments with reference to the attached drawings.

DESCRIPTION OF THE EMBODIMENTS

Embodiments of a display apparatus according to the present invention and an imaging system using the display apparatus is described.

Before describing the display apparatus according to the present invention and the imaging system using the display apparatus, problems of the related display apparatus described above is confirmed first as below.

Figure 20:
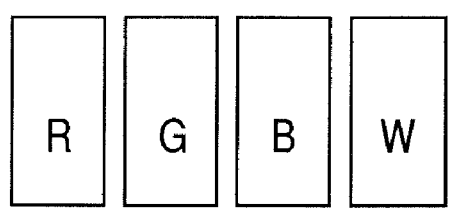
FIG. 20 is a diagram illustrating a related arrangement of R, G, B and W sub-pixels.
Figure 21:
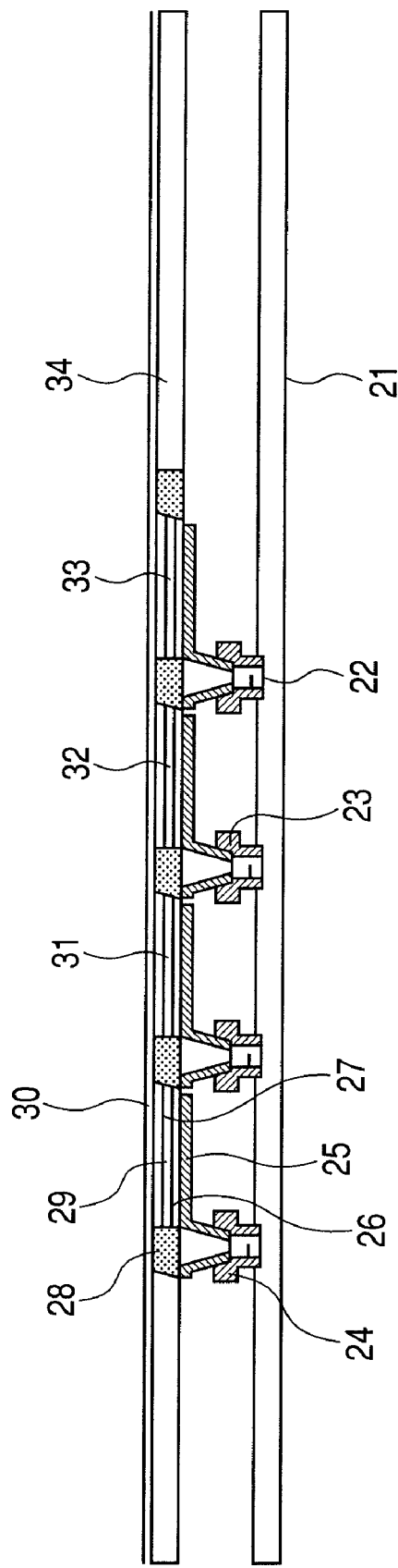
FIG. 21 is a diagram illustrating a related vertical structure of the display apparatus.
Figure 22:
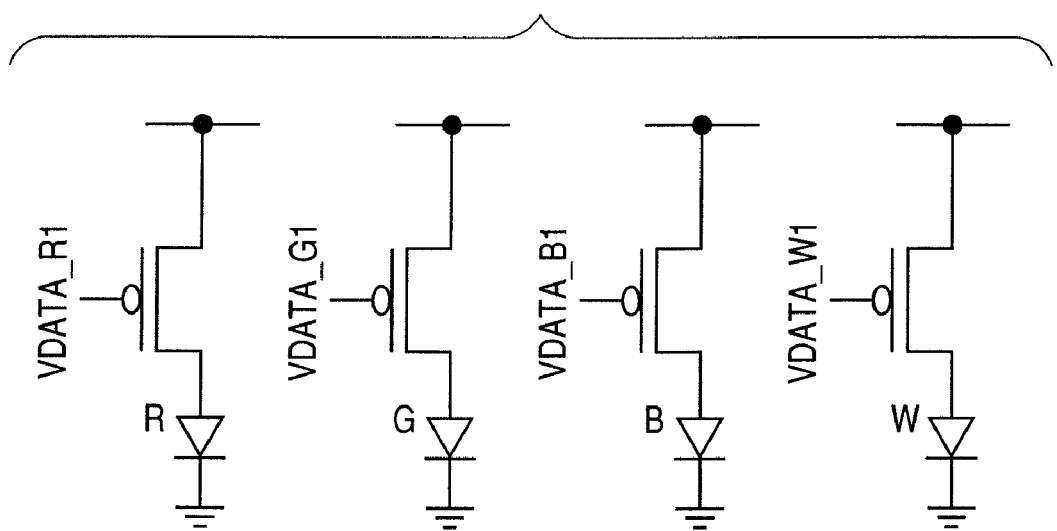
FIG. 22 is a diagram of an equivalent circuit for driving related R, G, B and W light emitting devices.

R, G, B and W light emitting devices having a vertical structure illustrated in FIG. 21 is manufactured so as to realize an arrangement of sub-pixels illustrated in FIG. 20. Here, numeral 21 denotes a TFT substrate, numeral 22 denotes a TFT, numeral 23 denotes a drain, numeral 24 denotes a source, numeral 25 denotes an anode, numeral 26 denotes a hole transporting layer, numeral 27 denotes an electron transporting layer, numeral 28 denotes an device isolation film, numeral 29 denotes an R organic layer, numeral 30 denotes a cathode, numeral 31 denotes a G organic layer, numeral 32 denotes a B organic layer, numeral 33 denotes a white organic layer, and numeral 34 denotes a planarization film. Note that those light emitting devices are controlled to have light emitting quantities independent of each other as illustrated in FIG. 22.

Figure 9:
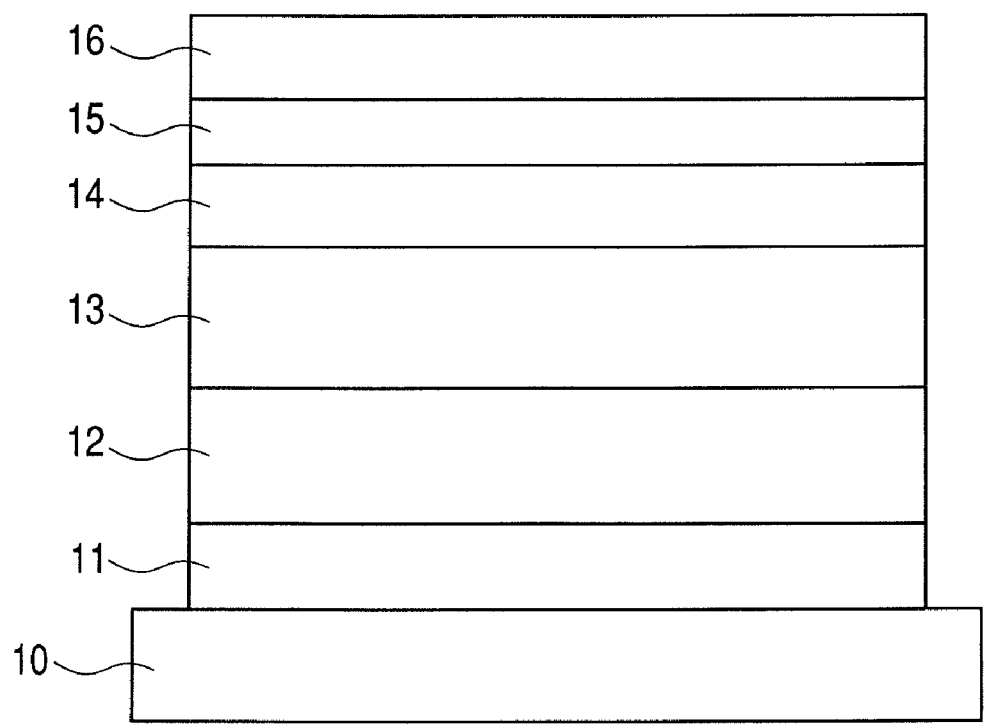
FIG. 9 is a diagram illustrating a structure of a light emitting device.

Each of the R, G, B and W light emitting devices has a device structure as illustrated in FIG. 9. Here, numeral 10 denotes a glass substrate, numeral 11 denotes a metallic anode having reflecting property (a reflective electrode), numeral 12 denotes a hole transporting layer, numeral 13 denotes a light emitting layer, numeral 14 denotes an electron transporting layer, numeral 15 denotes a electron injecting layer, and numeral 16 denotes a transparent conductive cathode (a transparent electrode).

The light emitting device emits light that is unique to its material when an electron recombines with a hole in the light emitting layer 13. On this occasion, light emitted toward the transparent electrode 16 interferes with light from the reflective electrode 11, so light from the transparent electrode 16 becomes to have light emission color different from PL light emission color of the material itself.

Figure 3:
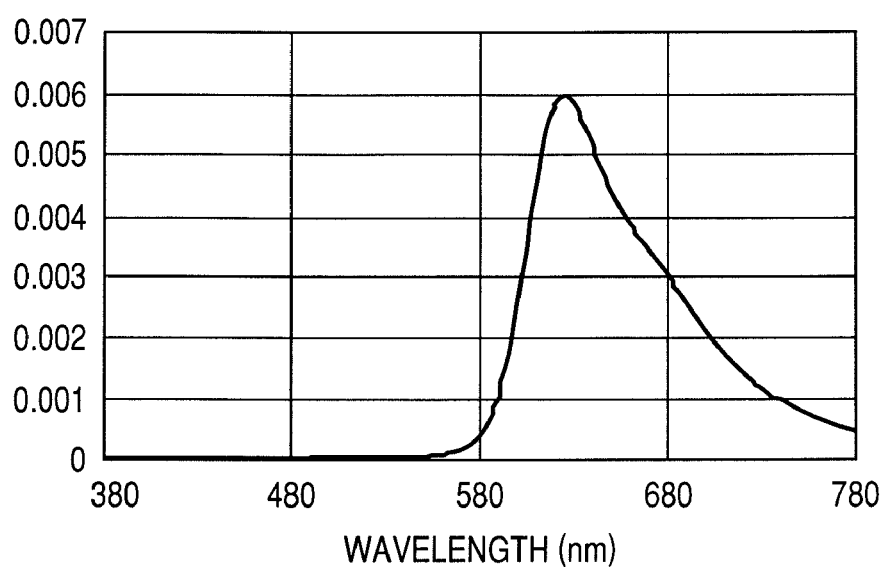
FIG. 3 is a PL spectrum diagram of an R light emitting material.
Figure 4:
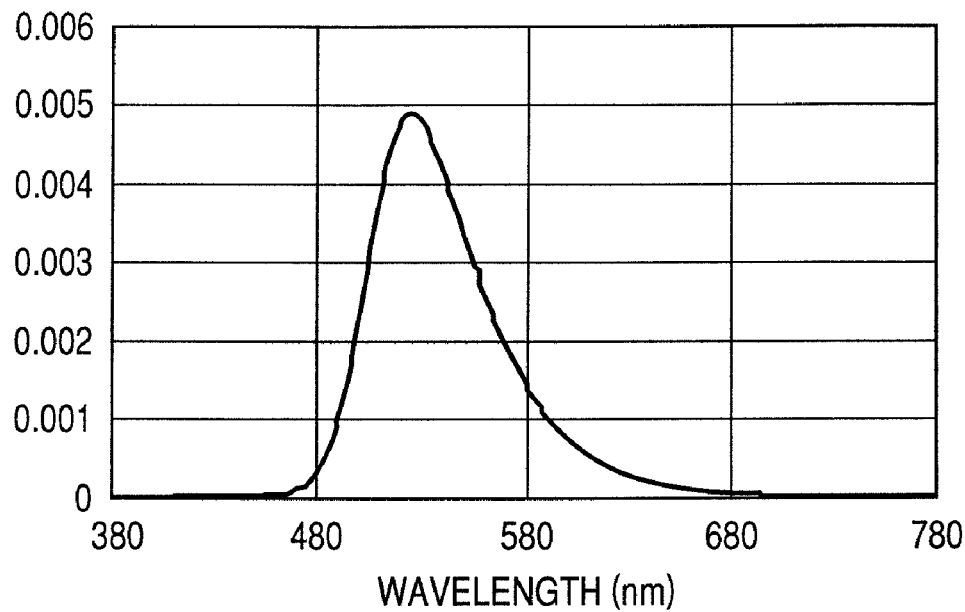
FIG. 4 is a PL spectrum diagram of a G light emitting material.
Figure 5:
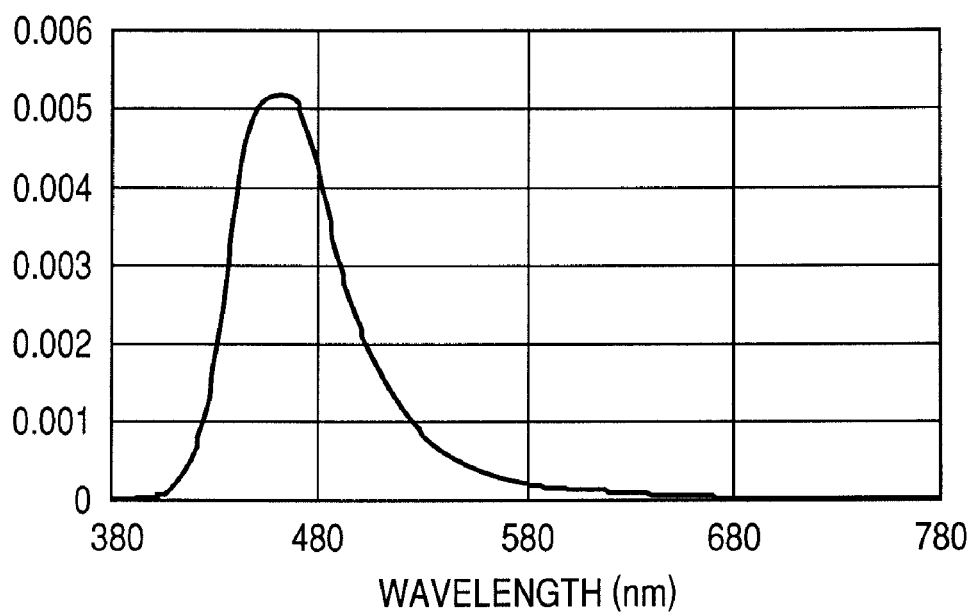
FIG. 5 is a PL spectrum diagram of a B light emitting material.

An R light emitting material having a PL (photoluminescence) spectrum shape illustrated in FIG. 3, a G light emitting material having a PL spectrum shape illustrated in FIG. 4 and a B light emitting material having a PL spectrum shape illustrated in FIG. 5 are used as the light emitting layers 13 of the R, G and B light emitting devices (sub-pixels), respectively.

Figure 23:
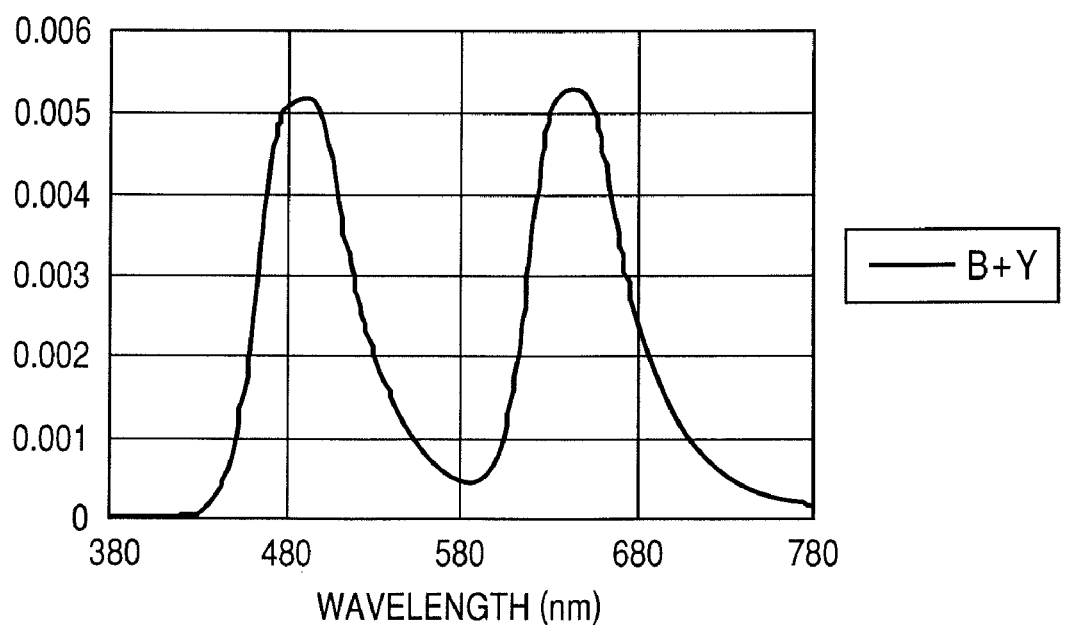
FIG. 23 is a PL spectrum diagram of the W sub-pixel.

On the other hand, a W light emitting material having a PL spectrum shape illustrated in FIG. 23 is used as the light emitting layer 13 of the W sub-pixel. Here, the material of the light emitting layer 13 of the W sub-pixel is prepared by mixing the B and Y light emitting materials, so the PL spectrum thereof has a shape as illustrated in FIG. 23.

When an interference effect is not considered, chromaticity coordinates of white PL light emissions of those two types (the light emissions of the R+G+B sub-pixel group and the light emissions of the B+Y sub-pixels (W sub-pixel)) have metamerism as illustrated in Tables 1 and 2 below.

TABLE 1

| X | Y | |
|---|---|---|
| 0.321608939 | 0.334687128 | R + G + B |

TABLE 2

| X | Y | |
|---|---|---|
| 0.321608939 | 0.334687128 | B + Y |

The chromaticity coordinates were measured concerning the light emissions of the R+G+B sub-pixel group and the light emission of the W sub-pixel considered for the interference effect. Each of the white chromaticity coordinates is illustrated in Tables 3 and 4.

TABLE 3

| X | Y | |
|---|---|---|
| 0.29981 | 0.3501 | R + G + B (with interference) |

TABLE 4

| X | Y | |
|---|---|---|
| 0.31428 | 0.38418 | B + Y (with interference) |

When the interference effect is not considered in the PL light emission of the material itself, the light emissions of the R+G+B sub-pixel group and the light emission of the W sub-pixel have chromaticity coordinates of the metamerism. However, as to light from the sub-pixel considered for the interference effect, the chromaticity coordinates of the light emissions of the R+G+B sub-pixel group are shifted from the chromaticity coordinates of the light emission of the W sub-pixel.

Therefore, the display apparatus using interference cannot obtain a desired chromaticity coordinates of white when the light emissions of the R+G+B sub-pixel group of the metamerism is mixed simply with the light emission of the W sub-pixel.

Figure 10:
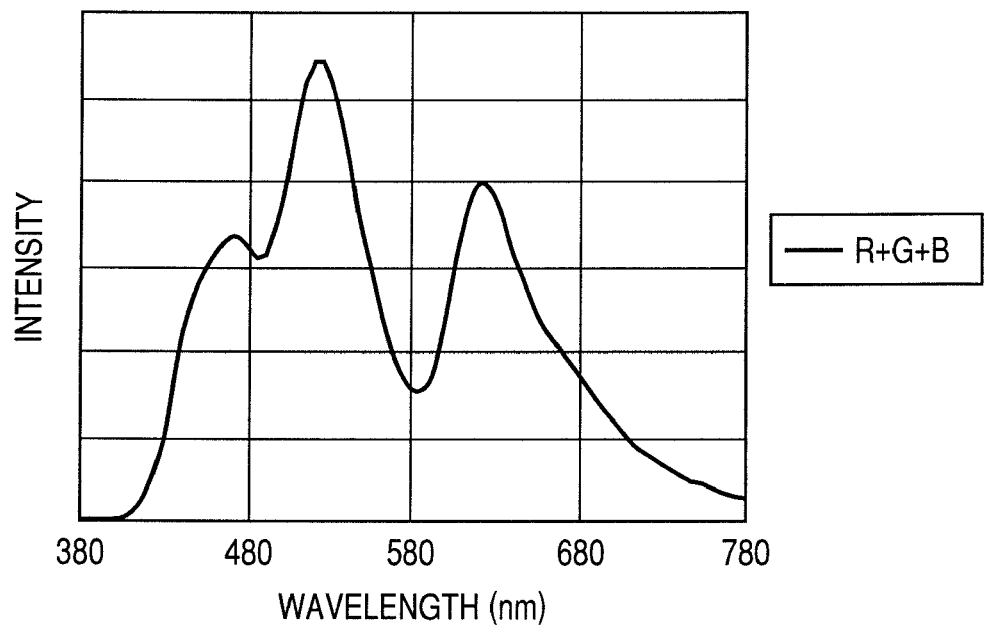
FIG. 10 is an emission spectrum diagram of the R+G+B sub-pixel group in a display apparatus using interference.
Figure 24:
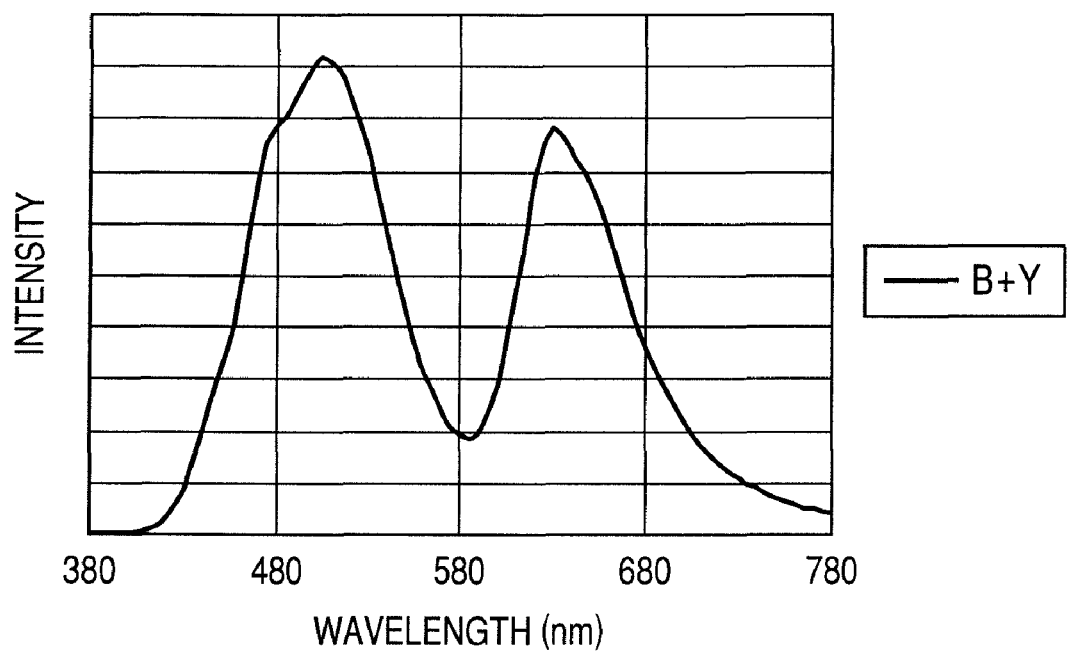
FIG. 24 is an emission spectrum diagram of the W sub-pixel in the display apparatus using interference.
Figure 25:
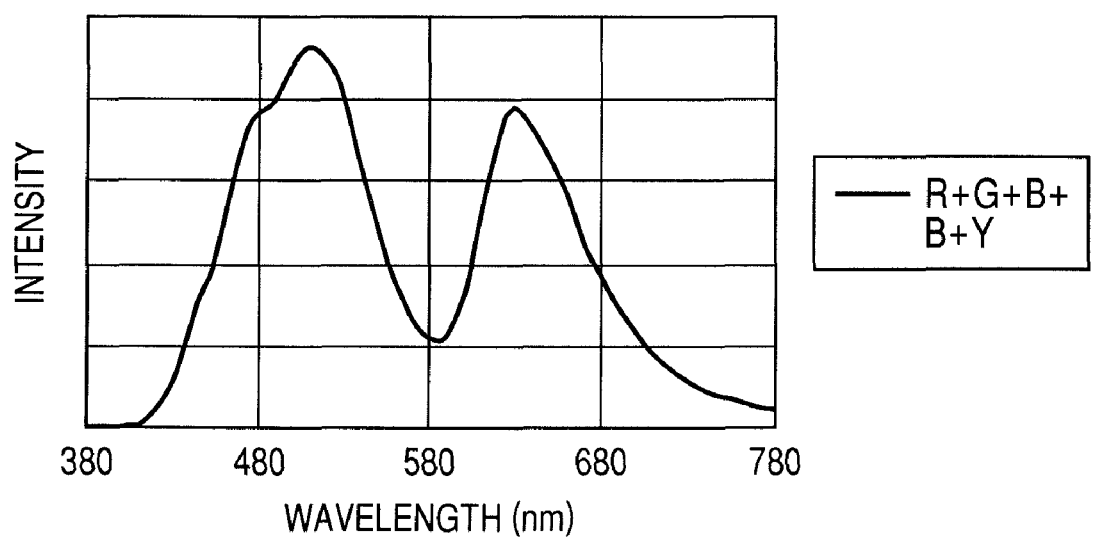
FIG. 25 is an emission spectrum diagram of the R+G+B+W sub-pixels in the display apparatus using interference.

The spectrum of the light emissions of the R+G+B sub-pixel group after the interference is illustrated in FIG. 10, and the spectrum of the light emission of the W sub-pixel after the interference is illustrated in FIG. 24. When those spectra are mixed, the light emission of the spectrum as illustrated in FIG. 25 can be obtained. This shape is different from each of the shapes illustrated in FIGS. 10 and 24, so it is understood that a desired chromaticity coordinates of white cannot be obtained.

Therefore, the display apparatus of the present invention includes a plurality of light emitting devices including a reflective layer and a light emitting layer that are stacked, in which each of the light emitting devices uses an interference between light directed from the light emitting layer to the reflective layer so as to be reflected by the reflective layer and light directed from the light emitting layer in the direction opposite to the reflective layer. In addition, the display apparatus has a structure including a first light emitting device, a second light emitting device having a light emission color different from the first light emitting device and a third light emitting device having the same emission spectrum as a spectrum in which a light emission of the first light emitting device and a light emission of the second light emitting device are mixed.

In other words, the spectrum of the light emission obtained by mixing the light emission of the first light emitting device with the light emission of the second light emitting device (i.e., "mixed light of sub-pixel group") has substantially the same shape as the spectrum of the light emission of the third light emitting device (i.e., "light emission from a sub-pixel of metamerism").

Specific ways for realizing the above-mentioned structure are as follows.

(1) The first light emitting device and the second light emitting device are successively stacked on the substrate. The third light emitting device is arranged on the substrate.

(2) The first light emitting device, the second light emitting device and the third light emitting device are arranged on the substrate. The third light emitting device is formed of a light emitting material having the emission spectrum of the first light emitting device and a light emitting material having the emission spectrum of the second light emitting device.

In the above-mentioned structure (2), namely, the sub-pixels of the first light emitting device and the second light emitting device are arranged separately, and the sub-pixels are connected to each other so as to constitute the third light emitting device.

Note that the structures of the first light emitting device, the second light emitting device and the third light emitting device are not limited to the above-mentioned structures. It is possible to obtain the "light emission of the third light emitting device" by combining a light emitting material having the same spectrum as the "mixed light of sub-pixels".

Here, the same spectrum (shape) means a condition in which the number of peak values of light emission wavelengths is the same between the "mixed light of sub-pixel group" and the "light emission from a sub-pixel of metamerism", all peak wavelengths are within the range of ±5 nm, and all half-width thereof are within the range of ±5 nm.

In each of the embodiments described below, R and G light emitting devices were used as the first light emitting device and the second light emitting device, respectively, and a B light emitting device was added. Further, a W light emitting device was used as the third light emitting device.

Example 1

This example is related to a display apparatus having the above-mentioned structure (1).

Figure 1:
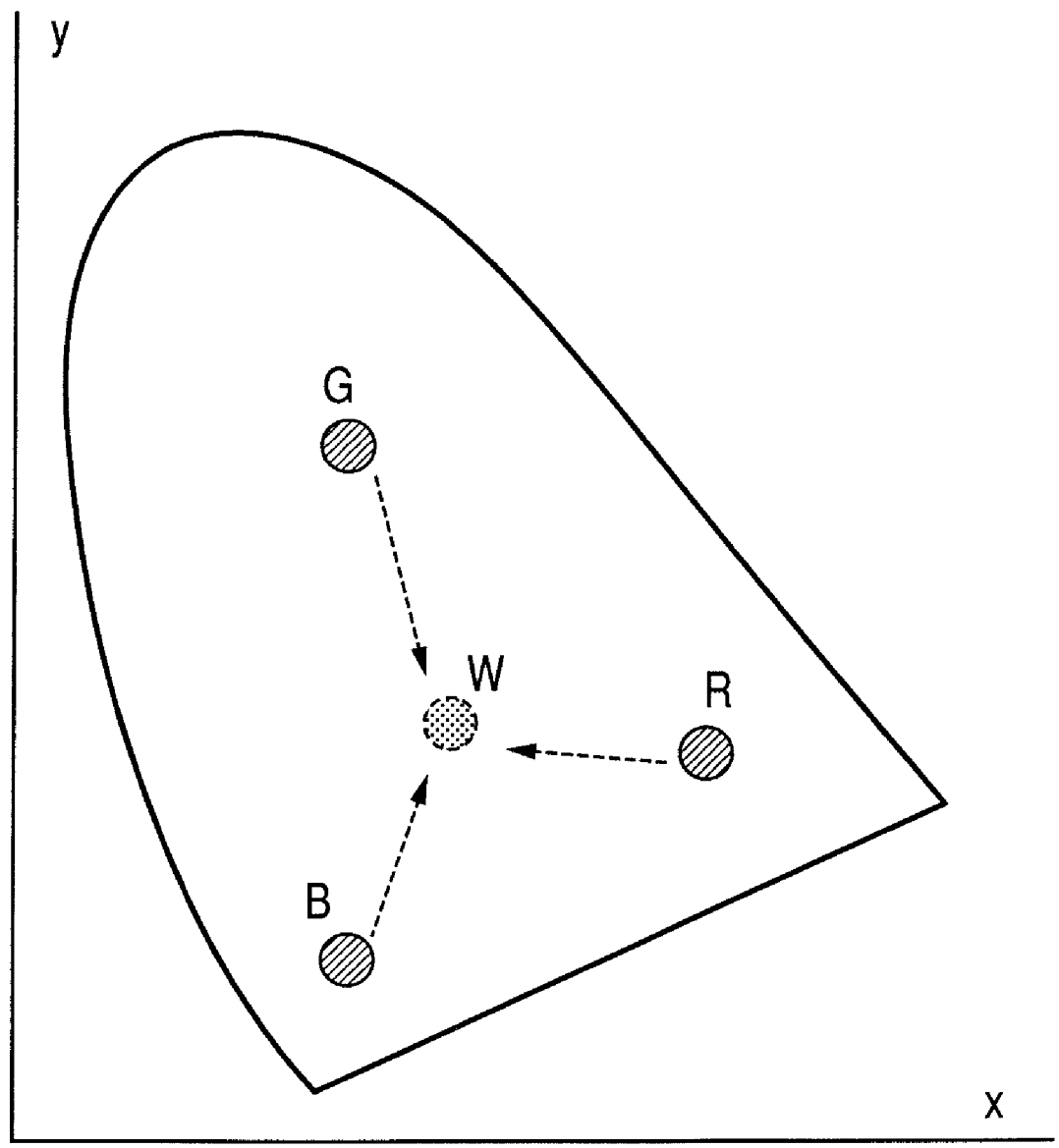
FIG. 1 is a CIE chromaticity coordinate diagram of light emissions of R, G and B light emitting devices and mixed light thereof.
Figure 2:
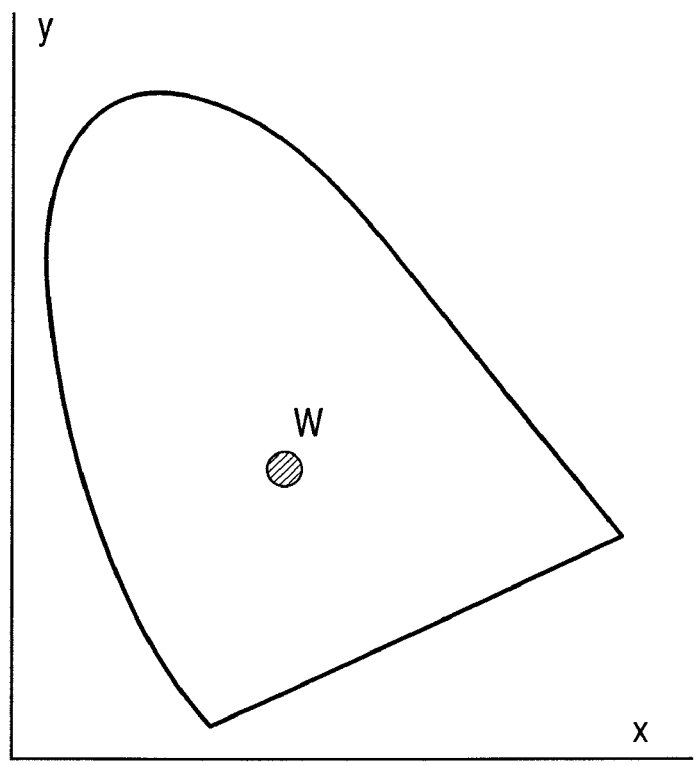
FIG. 2 is a CIE chromaticity coordinate diagram of a W light emitting device.

The R+G+B sub-pixel group including R, G and B light emitting devices illustrated in the chromaticity coordinates of FIG. 1 and the W sub-pixel illustrated in the chromaticity coordinates of FIG. 2 were arranged side by side in the area of the display surface. Here, the chromaticity coordinates of the W sub-pixel illustrated in FIG. 2 were the same as the W chromaticity coordinates illustrated in FIG. 1. In this display apparatus, a target white color had the chromaticity coordinates illustrated in FIGS. 1 and 2.

Hereinafter, a relationship between spectra of light emitting materials of the chromaticity coordinates will be described in more detail.

The R light emitting material had the PL spectrum shape illustrated in FIG. 3, the G light emitting material had the PL spectrum shape illustrated in FIG. 4, and the B light emitting material had the PL spectrum shape illustrated in FIG. 5. In addition, the PL spectrum of the light emissions of the R+G+B sub-pixel group had the shape illustrated in FIG. 6.

Figure 6:
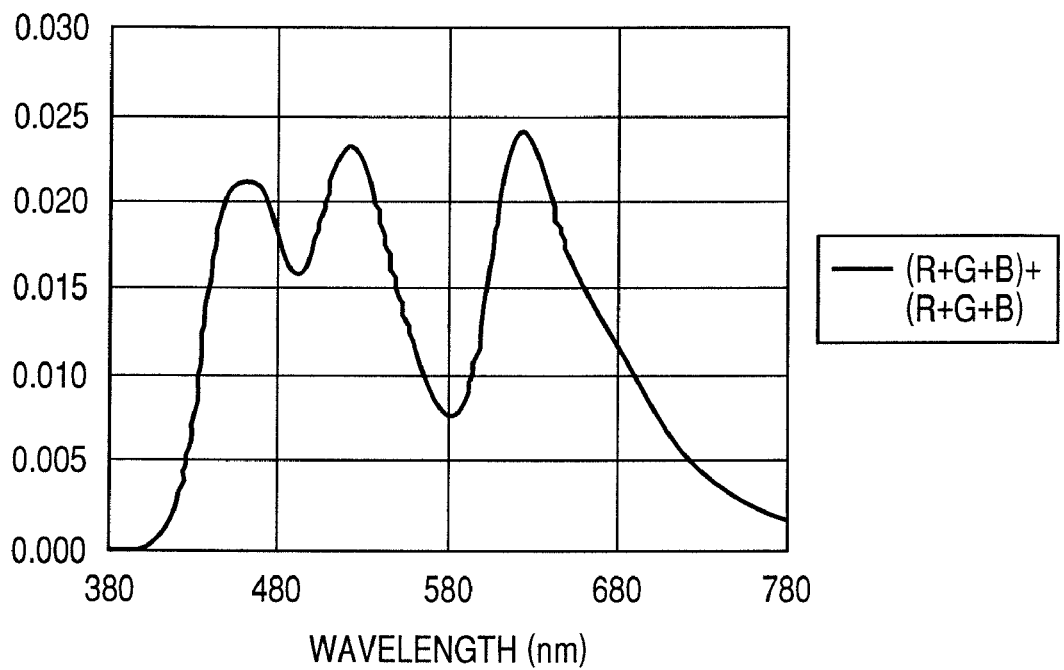
FIG. 6 is a PL spectrum diagram of mixed light of R+G+B sub-pixel group.
Figure 7:
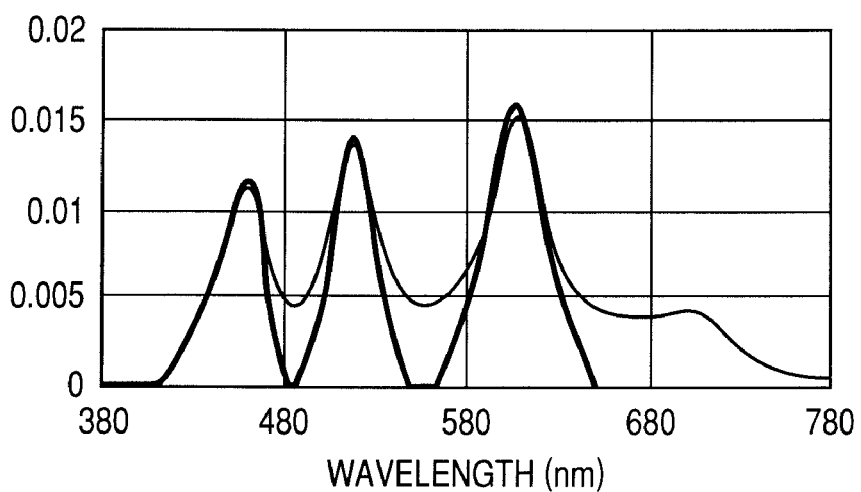
FIG. 7 is an emission spectrum diagram of the R+G+B sub-pixel group.
Figure 8:
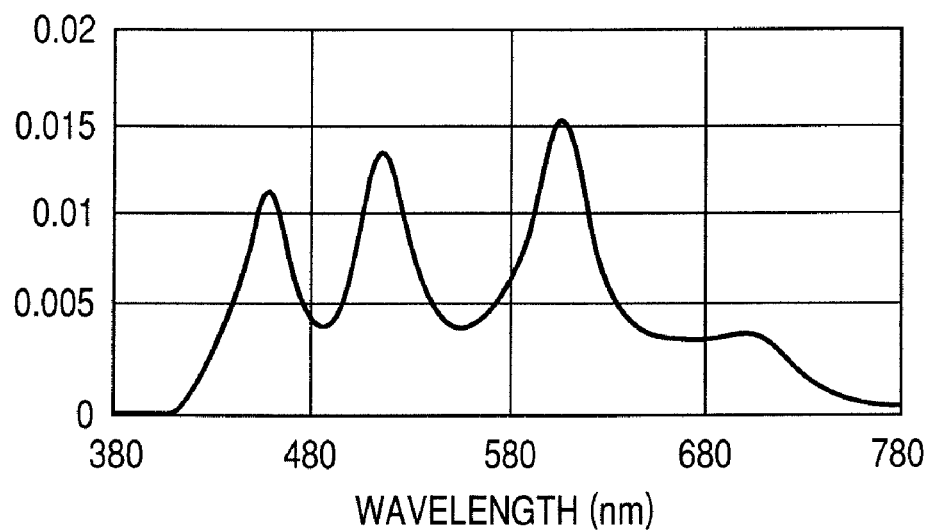
FIG. 8 is an emission spectrum diagram of W sub-pixel group.

The light emission of the W sub-pixel was adapted to have the same spectrum as the PL spectrum illustrated in FIG. 6 in which the light emissions of the R, G and B light emitting devices were mixed at a predetermined ratio. Therefore, the chromaticity coordinates of those two types of white PL light emissions were the metamerism and have the same spectrum shape, which was the relationship of spectrum between the light emissions of the R+G+B sub-pixel group illustrated in FIG. 7 and the light emission of the W sub-pixel illustrated in FIG. 8.

Using those materials, the light emitting device having the device structure illustrated in FIG. 9 using interference was manufactured. The spectrum of the white light emissions of the R+G+B sub-pixel group including the R, G and B light emitting devices having the above-mentioned device structure and the white light emission of the W sub-pixel had a shape as illustrated in FIG. 10. Each of the chromaticity coordinates was measured, and it was found that the chromaticity coordinates of white after the interference are the same therebetween as illustrated in Table 5.

TABLE 5

| X | Y | |
|---|---|---|
| 0.31871 | 0.3892 | R + G + B (with interference) |

Figure 11:
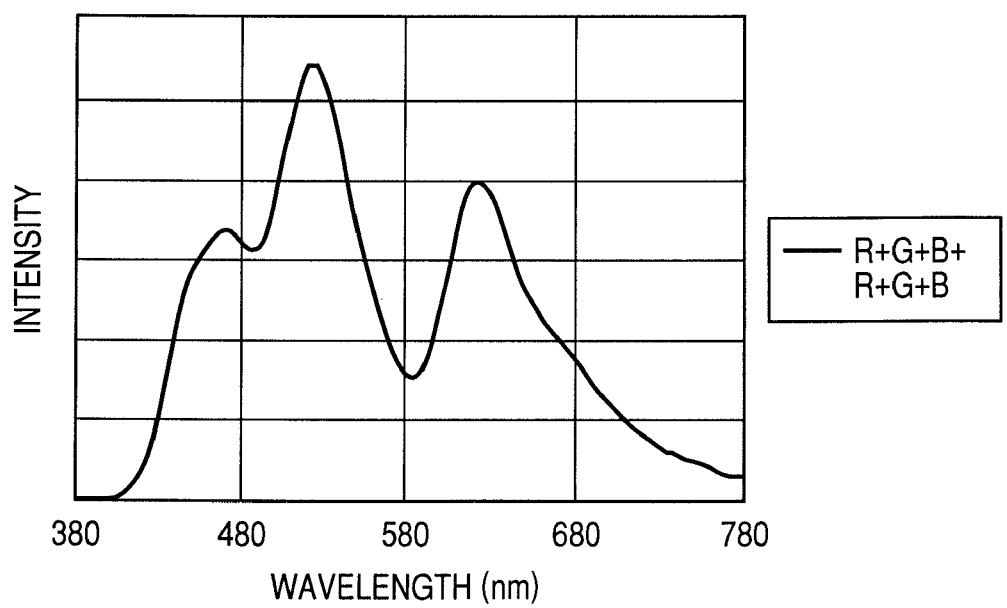
FIG. 11 is an emission spectrum diagram of R+G+B+W sub-pixel group in the display apparatus using interference.

On the other hand, the spectrum of the mixture of lights after the interference had a shape as illustrated in FIG. 11. The chromaticity coordinates of white of this spectrum is illustrated in Table 6.

TABLE 6

| X | Y | |
|---|---|---|
| 0.31871 | 0.3892 | R + G + B + W (with interference) |

In this way, when the spectrum shape was the same, white coordinates were not shifted when the light emission of the W sub-pixel was mixed with the light emissions of the R+G+B sub-pixel group using the interference. This can also be applied to the case of light emission of the W sub-pixel indicating the above-mentioned spectrum shape illustrated in FIG. 23, and the same effect can be obtained when the other sub-pixel is included with B and Y light emitting devices so that the mixed spectrum thereof can be the same. As understood from this, the number of sub-pixels can be 1, 2, ... n (n is an integer) as long as colors are mixed to generate another color.

The structure described below was adopted in order to match the mixed spectrum of the above-mentioned light emission of the first light emitting device and the light emission of the second light emitting device with the spectrum of the light emission of the third light emitting device.

Figure 12:
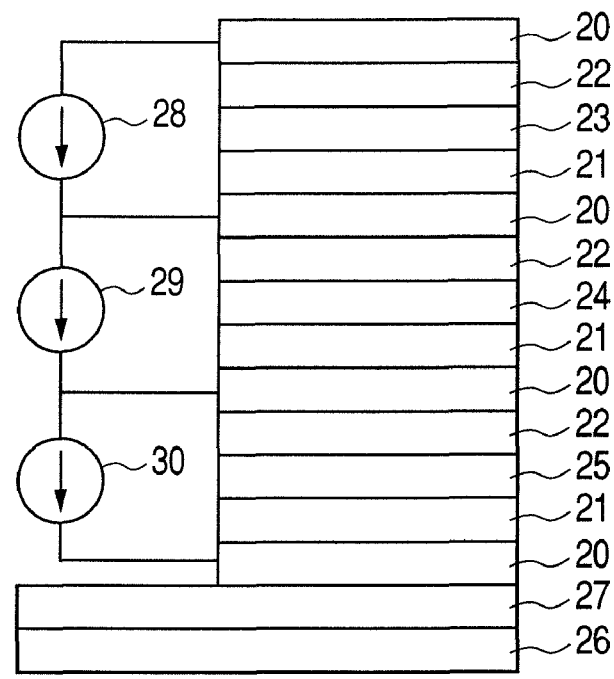
FIG. 12 is a diagram illustrating a structure of the R+G+B sub-pixel group having a vertically-stacked structure using interference.
Figure 13:
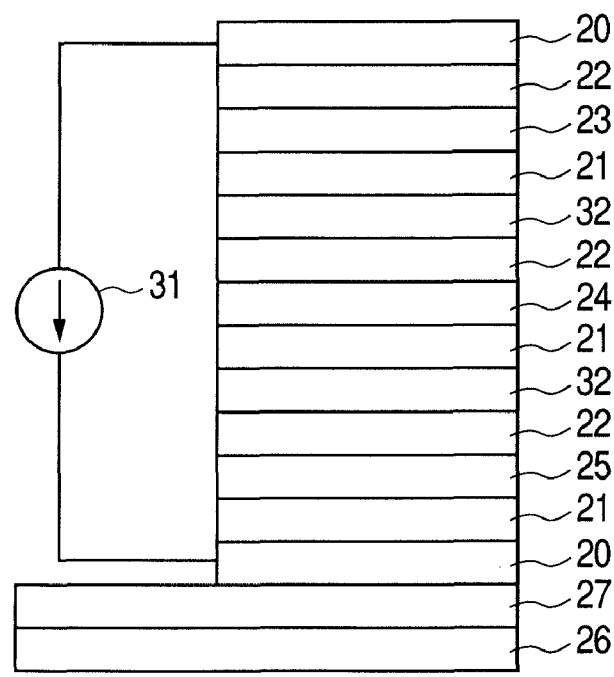
FIG. 13 is a diagram illustrating a structure of a W pixel having the vertically-stacked structure using interference.
Figure 14:
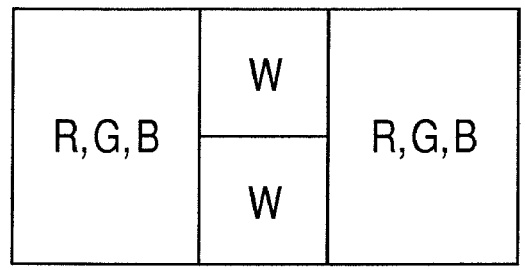
FIG. 14 is a diagram illustrating an arrangement of R, G, B and W sub-pixels having the vertically-stacked structure using interference.

That is, a display apparatus having pixels of the following structure is manufactured. The pixel is a combination of sub-pixel group in which R, G and B light emitting devices are stacked vertically as illustrated in FIG. 12, and a W light emitting device in which light emitting materials having the same spectrum as the mixed spectrum of the light emissions of the R+G+B sub-pixel group are stacked as illustrated in FIG. 13. FIG. 14 illustrates an arrangement of sub-pixels of the display apparatus, and two pixels are arranged here for easy understanding.

In the diagrams, numeral 26 denotes a glass substrate, numeral 27 denotes a reflector plate for causing interference. Numeral 32 denotes a transparent conductive layer made of a transparent oxide conductive material such as ITO or IZO, for example. Numeral 20 denotes a transparent electrode, numeral 21 denotes a layer for injecting and transferring holes in the light emitting layer, numeral 23 denotes a B light emitting layer, and numeral 24 denotes an R light emitting layer. Numeral 25 denotes a G light emitting layer, and numeral 22 denotes a layer for injecting and transferring electrons from a cathode in the light emitting layer. Numeral 28 denotes drive current to be supplied to the B light emitting device, numeral 29 denotes drive current to be supplied to the R light emitting device, numeral 30 denotes drive current to be supplied to the G light emitting device, and numeral 31 denotes drive current to be supplied to the W sub-pixel. In other words, the R+G+B sub-pixel group have a structure of stacking the light emitting materials, and the W sub-pixel also has a structure of stacking the light emitting materials. Note that the light emitting device can be an organic light emitting device (organic EL element) so that a thin display apparatus having a relatively simple structure can be formed.

In the display apparatus having the structure described above, the mixed spectrum of the light emissions of the R+G+B sub-pixel group is the same as the spectrum of the light emission of the W sub-pixel. Therefore, the light emissions of the R+G+B sub-pixel group and the light emission of the W sub-pixel have the same spectrum. As a result, even the display apparatus using interference does not cause the white color shift due to mixing of the light emissions of the R+G+B sub-pixel group with the light emission of the W sub-pixel.

Example 2

The present example is related to a display apparatus having the above-mentioned structure (2).

Figure 15:
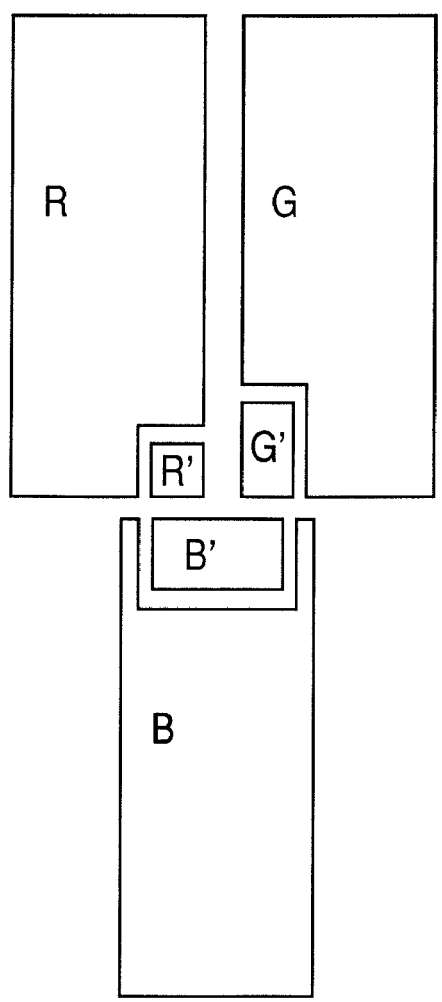
FIG. 15 is a diagram illustrating an arrangement of R, G, B, and W (R'+G'+B') sub-pixels having a planar structure using interference.

For matching the mixed spectrum of the light emission of the first light emitting device and the light emission of the second light emitting device with the emission spectrum of the third light emitting device, a display apparatus was manufactured that had an arrangement of sub-pixels in which the R, G and B light emitting devices and R', G' and B' light emitting devices as the W sub-pixel were combined as illustrated in FIG. 15.

In other words, the manufactured display apparatus had pixels each of which was a combination of a sub-pixel including the R, G and B light emitting devices and the W sub-pixel including the R', G' and B' light emitting devices in which light emitting materials having the same spectrum as the mixed spectrum of the light emissions of the R+G+B sub-pixel group were arranged.

The R, G and B light emitting devices and the R', G' and B' light emitting devices had the device structure as illustrated in FIG. 9.

Figure 16A:
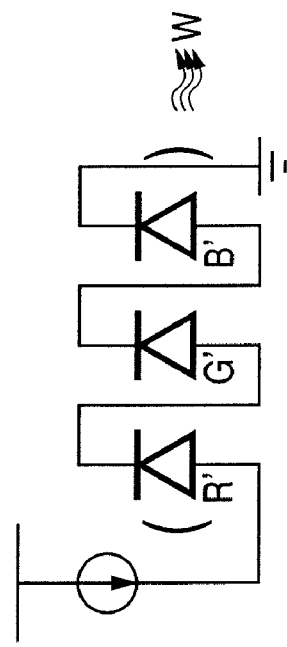
FIGS. 16A and 16B are diagrams illustrating drive of R, G, B and W light emitting devices having the planar structure.
Figure 16B:
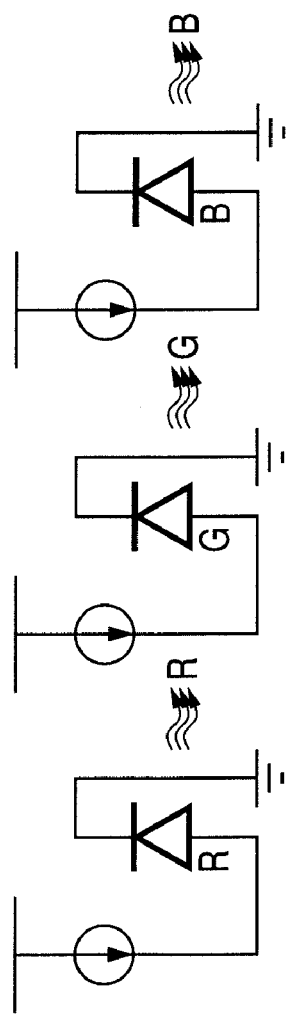

The R, G and B sub-pixels that were arranged on a plane were supplied with individual drive current as illustrated in FIG. 16A so as to emit light. In addition, the R', G' and B' light emitting devices as the W sub-pixel were connected in series and supplied with drive current simultaneously as illustrated in FIG. 16B so as to emit light.

Thus, the light emissions of the R+G+B sub-pixel group and the light emission of the W sub-pixel had the same spectrum, and even the display apparatus using interference did not cause the white color shift due to mixing of the light emissions of the R+G+B sub-pixel group with the light emission of the W sub-pixel.

Although the R, G and B sub-pixels and the R', G' and B' light emitting devices were arranged on one side of the substrate according to the arrangement of sub-pixels illustrated in FIG. 15, it is possible to arrange the R', G' and B' light emitting devices on the other side of the substrate at individual positions below the R, G and B sub-pixels.

The light emitting device of the present example can also be an organic light emitting device (organic EL device) so that a thin display apparatus having a relatively simple structure can be formed.

Example 3

The present example describes that even when an angle of viewing the display apparatus (view angle) changes, no chromaticity difference is caused between the light emission colors, because the light emission colors of the R+G+B sub-pixel group and the light emission color of the W sub-pixel change in the same manner.

Similarly to the above description, the chromaticity coordinates of the white light emission of the sub-pixel group including the R, G and B light emitting devices having the device structure illustrated in FIG. 9 using the interference effect with the additional B light emitting device and the white light emission of the W sub-pixel were measured. The chromaticity coordinates of white light emissions are illustrated in Tables 7 and 8, respectively. The chromaticity coordinates were as illustrated in Table 3 in the case where the light emissions of the R, G and B light emitting devices were mixed. In contrast, when the light emission of the B light emitting device was further mixed to the light emissions of the R, G and B light emitting devices, the metamerism illustrated in Table 7 was obtained, which was the same as the chromaticity coordinates of the light emission of the W sub-pixel illustrated in Table 8.

TABLE 7

| X | Y | |
|---|---|---|
| 0.31428 | 0.38418 | R + G + B (with interference) |

TABLE 8

| X | Y | |
|---|---|---|
| 0.31428 | 0.38418 | B + Y (with interference) |

In this case, a desired chromaticity coordinates of white could not be obtained in the display apparatus using an interference as described above, in the case where the mixing ratio was changed from a value of combination of chromaticity coordinates between the light emissions of the R+G+B (+B) sub-pixels and the light emission of the W sub-pixel in the metamerism.

Figure 17:
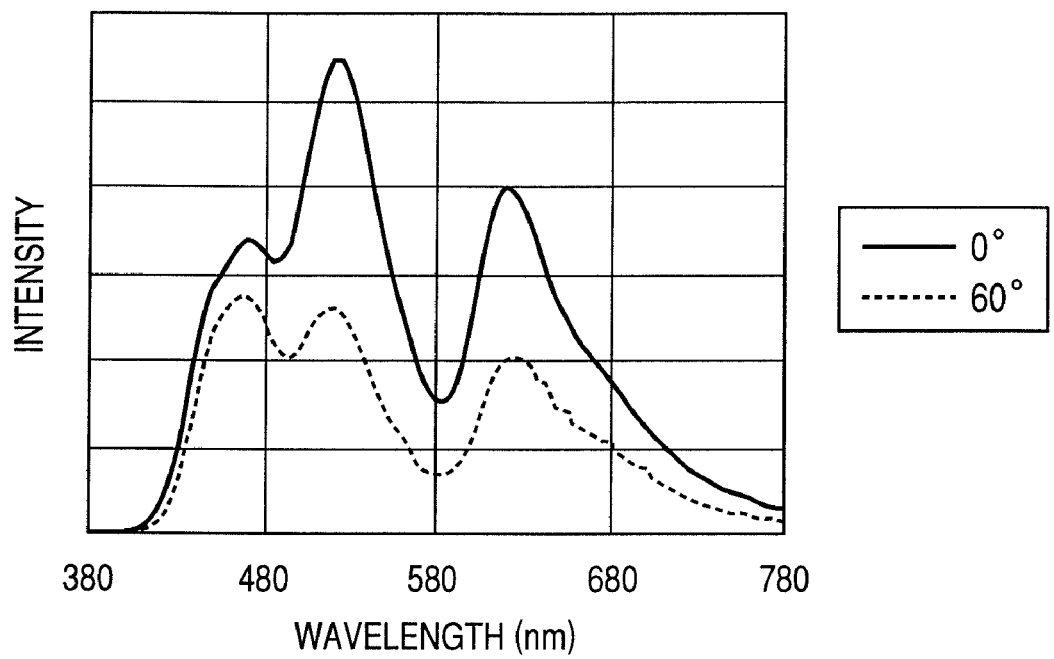
FIG. 17 is an emission spectrum diagram of the R+G+B+ (B) sub-pixel group of the display apparatus using interference at 0 degree and 60 degrees.
Figure 18:
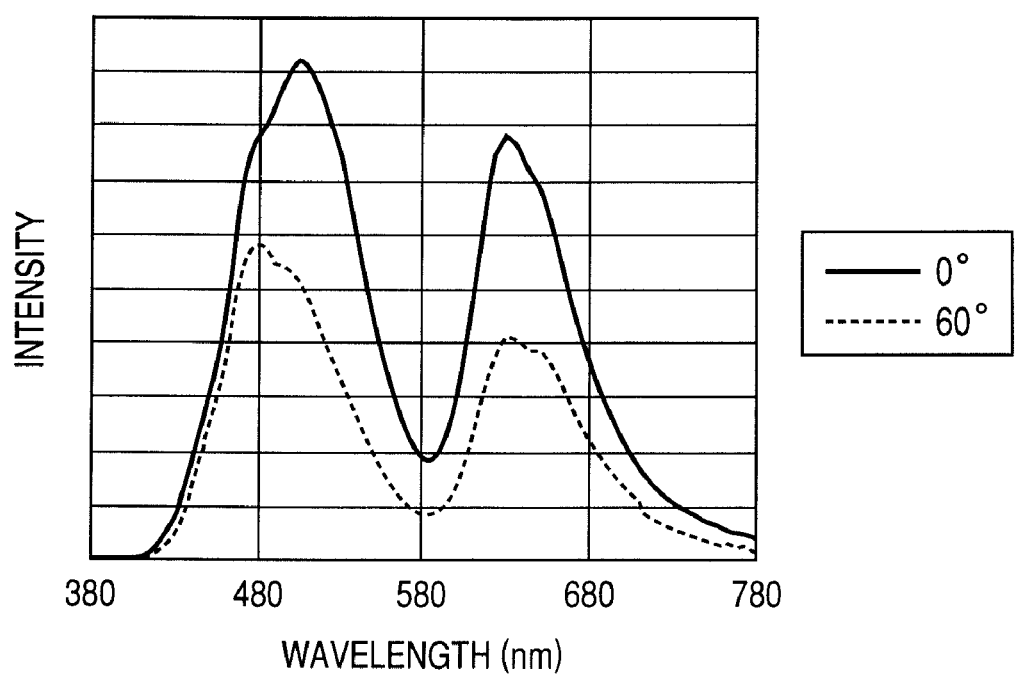
FIG. 18 is an emission spectrum diagram of a W (B+Y) sub-pixel of the display apparatus using interference at 0 degree and 60 degrees.

In addition, the view angle was tilted from the normal direction of the display surface, while the chromaticity coordinates of the light emissions of the R+G+B (+B) sub-pixel group indicated with the spectrum illustrated in FIG. 17 at 0 degree and 60 degrees and the light emission of the W sub-pixel indicated with the spectrum illustrated in FIG. 18 at 0 degree and 60 degrees were measured. Results thereof are illustrated in Tables 9 and 10. Even when the B light emitting device was added so that the chromaticity coordinates of the display apparatus became the metamerism, a desired chromaticity coordinates of white could not be obtained when the view angle was tilted from the normal direction of the display surface so that the interference condition changed.

TABLE 9

| | X | Y | |
|---|---|---|---|
| 0 degree | 0.31428 | 0.38418 | R + G + B (with interference) |
| 60 degrees | 0.29 | 0.32267 | |

TABLE 10

| | X | Y | |
|---|---|---|---|
| 0 degree | 0.31428 | 0.38418 | B + Y (with interference) |
| 60 degrees | 0.2849 | 0.32223 | |

Therefore, as illustrated in the above-mentioned Example 1, the light emission of the R+G+B sub-pixel group indicated with the chromaticity coordinates illustrated in FIG. 1 (mixed light) was arranged adjacent to the light emission of the W sub-pixel indicated with the chromaticity coordinates illustrated in FIG. 2. Here, the chromaticity coordinates of the light emission of the W sub-pixel illustrated in FIG. 2 is the same as the W chromaticity coordinates illustrated in FIG. 1. In this display apparatus, the target white color had the W chromaticity coordinates illustrated in FIGS. 1 and 2.

Hereinafter, the relationship of spectrum between the light emitting materials of the chromaticity coordinates will be described in more detail.

The R light emitting material had the PL spectrum shape illustrated in FIG. 3, the G light emitting material had the PL spectrum shape illustrated in FIG. 4, the B light emitting material had the PL spectrum shape illustrated in FIG. 5. In addition, the PL spectrum of the light emission of the R+G+B sub-pixel group had the shape illustrated in FIG. 6.

The light emission of the W sub-pixel was adapted to be the same as the PL spectrum illustrated in FIG. 6 in which the light emissions of the R, G and B light emitting devices were mixed at a predetermined ratio. Therefore, the chromaticity coordinates of those two types of white PL light emissions were the metamerism. The spectrum shapes thereof were also the same, so as to obtain a relationship of spectrum between the light emissions of the R+G+B sub-pixel group illustrated in FIG. 7 and the light emission of the W sub-pixel illustrated in FIG. 8.

In this case, a desired chromaticity coordinates of white could be obtained in the display apparatus using an interference also in the case where the mixing ratio was changed from a value of combination of chromaticity coordinates between the light emissions of the R+G+B sub-pixel group and the light emission of the W sub-pixel in the metamerism.

Figure 19:
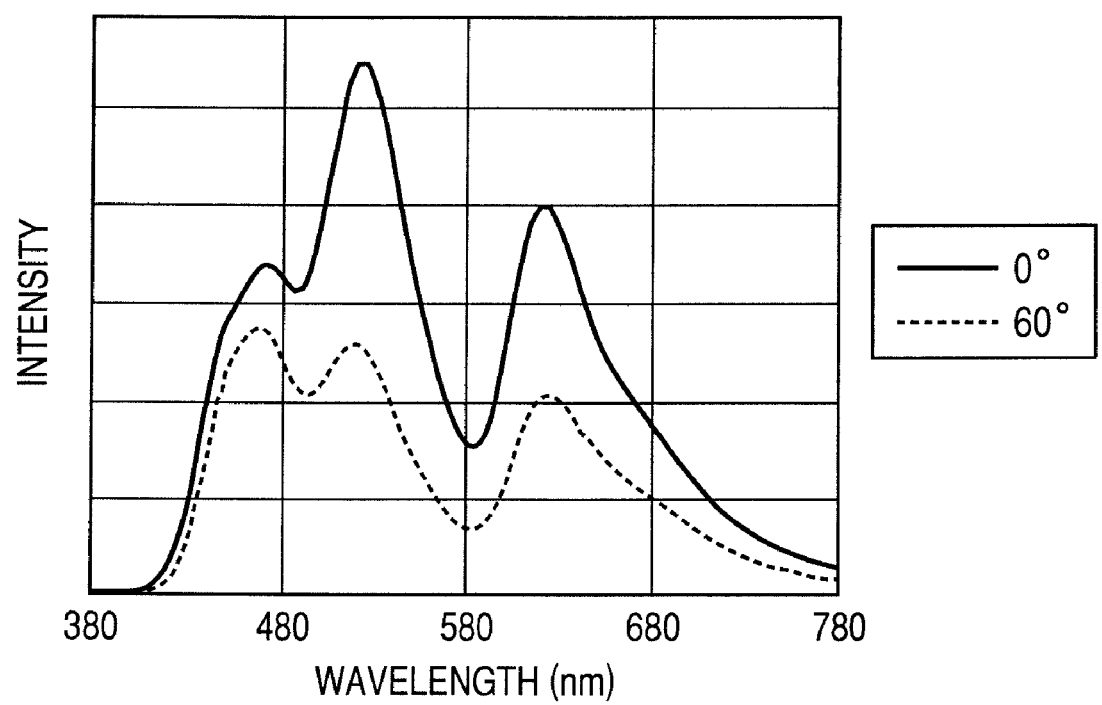
FIG. 19 is an emission spectrum diagram of the R+G+B sub-pixel group and the W (B+Y) sub-pixel of the display apparatus using interference at 0 degree and 60 degrees.

In addition, the view angle was tilted from the normal direction of the display surface, while the chromaticity coordinates of the light emissions of the R+G+B sub-pixel group at 0 degree and 60 degrees and the light emission of the W sub-pixel at 0 degree and 60 degrees were measured. Results thereof are illustrated in Table 11 for both the light emissions of the R+G+B sub-pixel group and the light emission of the W sub-pixel. As to the mixed light having the spectrum illustrated in FIG. 19, a desired chromaticity coordinates of white could be obtained even when the view angle was tilted from the normal direction of the display surface so that the interference condition was changed.

This is because that the spectrum of the W pixel is also changed similarly when the mixed spectrum of the R+G+B sub-pixel group is changed along with the change of the view angle. Therefore, even when the change of the mixed spectrum of the light emissions of the R+G+B sub-pixel group is summed up with the change of the spectrum of the light emission of the W sub-pixel, the spectrum of the W pixel is changed in the same manner as the mixed spectrum of the light emissions of the R+G+B+W sub-pixel group.

TABLE 11

| | X | Y | |
|---|---|---|---|
| 0 degrees | 0.31871 | 0.3892 | R + G + B (with interference) |
| 60 degrees | 0.29 | 0.32267 | R + G + B + Y (with interference) |

The light emitting device of the present example can also be an organic light emitting device (organic EL element) so that a thin display apparatus having a relatively simple structure can be formed.

Example 4

An imaging system (e.g., a digital camera) can be structured to include the display apparatus having the above-mentioned structure as a display part, so the imaging system having the above-mentioned effect can be realized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2007-178089, filed Jul. 6, 2007, and No. 2008-142260, filed May 30, 2008, which are hereby incorporated by reference herein in their entirety.

What is claimed is:

1. A display apparatus comprising:
   a substrate, and
   a pixel having a first sub-pixel, a second sub-pixel, a third sub-pixel, and a fourth sub-pixel,
   wherein the first to fourth sub-pixels each comprise a light emitting device, the light emitting device comprising a reflective layer, a light emitting layer and a single pair of electrodes;
   wherein interference occurs between (a) light directed from the light emitting layer to the reflective layer which is reflected by the reflective layer and (b) light directed from the light emitting layer in the direction opposite to the reflective layer;
   wherein the first sub-pixel comprises a first light emitting device;
   wherein the second sub-pixel comprises a second light emitting device having a light emission color different from the first light emitting device;
   wherein the third sub-pixel comprises a third light emitting device having a light emission color different from the first light emitting device and the second light emitting device;
   wherein the fourth sub-pixel comprises a fourth light emitting device having the same emission spectrum as a mixed spectrum of light emissions of the first light emitting device, light emissions of the second light emitting device and light emissions of the third light emitting device;
   wherein the first to third light emitting devices are successively stacked on a first region of the substrate;
   wherein the fourth light emitting device is arranged in a second region different from the first region;
   wherein the fourth light emitting device comprises a first diode having the same constitution as the first light emitting device, a second diode having the same constitution as the second light emitting device, and a third diode having the same constitution as the third light emitting device; and
   wherein the first to third diodes are successively stacked on the second region of the substrate.

2. The display apparatus according to claim 1, wherein the light emission colors of the first light emitting device, the second light emitting device, the third light emitting device, and the fourth light emitting device are red color, green color, blue color, and white color, respectively.

3. The display apparatus according to claim 1, wherein a mixed spectrum of light of light emission of the first light emitting device, light emission of the second light emitting device and light emission of the third light emitting device with light emission of the fourth light emitting device changes in the same manner as a change of a mixed spectrum of mixed light of the light emission of the first light emitting device, the light emission of the second light emitting device, the light emission of the third light emitting device and the light emission of the fourth light emitting device, even when a view angle is tilted from a normal direction of a display surface.

4. The display apparatus according to claim 1, wherein the light emitting device is an organic light emitting device.

5. An imaging system comprising the display apparatus according to claim 1 as a display part.

* * * * *